(12) United States Patent
Sandhu et al.

(10) Patent No.: US 8,323,995 B2
(45) Date of Patent: Dec. 4, 2012

(54) DIODES, AND METHODS OF FORMING DIODES

(75) Inventors: Gurtej S. Sandhu, Boise, ID (US); Bhaskar Srinivasan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 41 days.

(21) Appl. No.: 13/094,642

(22) Filed: Apr. 26, 2011

(65) Prior Publication Data

US 2011/0201200 A1 Aug. 18, 2011

Related U.S. Application Data

(63) Continuation of application No. 12/875,007, filed on Sep. 2, 2010, now Pat. No. 7,951,619, which is a continuation of application No. 12/128,334, filed on May 28, 2008, now Pat. No. 7,811,840.

(51) Int. Cl.
*H01L 21/00* (2006.01)
(52) U.S. Cl. .......... 438/22; 438/900; 438/902; 438/983; 257/103; 257/106; 257/910; 257/E21.008
(58) Field of Classification Search .......................... None
See application file for complete search history.

(56) References Cited

U.S. PATENT DOCUMENTS

| | | | |
|---|---|---|---|
| 3,972,059 A | 7/1976 | Distefano | |
| 4,968,389 A | 11/1990 | Satoh et al. | |
| 5,866,301 A | 2/1999 | Ide et al. | |
| 6,159,559 A | 12/2000 | Reber et al. | |
| 6,225,203 B1 | 5/2001 | Liu et al. | |
| 6,816,355 B2 | 11/2004 | Watanabe | |
| 7,205,247 B2 | 4/2007 | Lee et al. | |
| 2002/0094388 A1 | 7/2002 | Fonash et al. | |
| 2005/0115946 A1 | 6/2005 | Shim et al. | |
| 2005/0215070 A1 | 9/2005 | Kobayashi | |
| 2006/0044239 A1 | 3/2006 | Kamijo et al. | |
| 2006/0281330 A1 | 12/2006 | Ahn et al. | |
| 2006/0284246 A1 | 12/2006 | Forbes et al. | |
| 2007/0120110 A1 | 5/2007 | Estes et al. | |
| 2007/0181931 A1 | 8/2007 | Ahn et al. | |
| 2007/0184576 A1 | 8/2007 | Chang et al. | |
| 2007/0190744 A1 | 8/2007 | Hiraiwa et al. | |
| 2007/0254141 A1 | 11/2007 | Morse et al. | |
| 2007/0269683 A1 | 11/2007 | Chen et al. | |
| 2008/0073736 A1 | 3/2008 | Hwang | |
| 2008/0079075 A1 | 4/2008 | Seon et al. | |
| 2008/0087890 A1 | 4/2008 | Ahn et al. | |
| 2008/0096363 A1 | 4/2008 | Govindarajan | |
| 2008/0099829 A1 | 5/2008 | Forbes et al. | |

(Continued)

FOREIGN PATENT DOCUMENTS

CN 101070612 11/2007

(Continued)

OTHER PUBLICATIONS

Datta et al., "85nm Gate Length ENhancement and Depletion mode InSb Quantum Well Transistors for Ultra High Speed and Very Low Power Digital Logic Applications", IEEE, Aug. 2005, 4 pages.

(Continued)

*Primary Examiner* — Benjamin Sandvik
*Assistant Examiner* — Scott R Wilson
(74) *Attorney, Agent, or Firm* — Wells St. John P.S.

(57) ABSTRACT

Some embodiments include methods of forming diodes. The methods may include oxidation of an upper surface of a conductive electrode to form an oxide layer over the conductive electrode. In some embodiments, the methods may include formation of an oxidizable material over a conductive electrode, and subsequent oxidation of the oxidizable material to form an oxide layer over the conductive electrode. In some embodiments, the methods may include formation of a metal halide layer over a conductive electrode. Some embodiments include diodes that contain a metal halide layer between a pair of diode electrodes.

9 Claims, 5 Drawing Sheets

U.S. PATENT DOCUMENTS

2008/0101121 A1    5/2008    Kreupl

FOREIGN PATENT DOCUMENTS

| | | |
|---|---|---|
| JP | 58178539 | 10/1983 |
| JP | 08306988 | 11/1996 |
| JP | 2007142196 | 6/2007 |
| WO | WO 2006105281 | 10/2006 |
| WO | WO 2007126679 | 11/2007 |
| WO | WO 2009042540 | 12/2009 |

OTHER PUBLICATIONS

Kahn et al., "Anodic Oxidation During MEMS Processing of Silicon and Polysilicon: Native Oxides Can Be Thicker Than You Think", Journal of Microelectric Systems, vol. 14 (5), Oct. 2005, pp. 914-923.

Lee et al, "Low Leakage Current and High Dielectric Constant LPD-SiO2/MOCVD-TiO2 Film Grown on (NH4)2Sx Treated InP Substrate", 2005 International Conference on Indium Phosphide and Related Materials, IEEE, Jul. 2005, pp. 167-170.

Molinero et al., "Properties of oxidized porous silicon as insulator material for RF applications", IEEE, 2005, pp. 131-133.

Schwenzer et al., "Biologically Inspired Vapor-Diffusion Route to Metal Hydroxide Films at Low Temperature: Symthesis, Converstion and Applications", IEEE, Mar. 2006, pp. 271-273.

Taylor et al., "HfO2 and ZrO2 alternative gate dielectics for silicon devices by liquid injection chemical vapour deposition", Electronic Letters, vol. 38 (21), Oct. 10, 2002; pp. 1285-1286.

Wllk, G.D. et al., "High-k gate dielectrics: Current status and materials properties considerations", Journal of Applied Physics, vol. 89, (10), May 15, 2011; pp. 5243-5275.

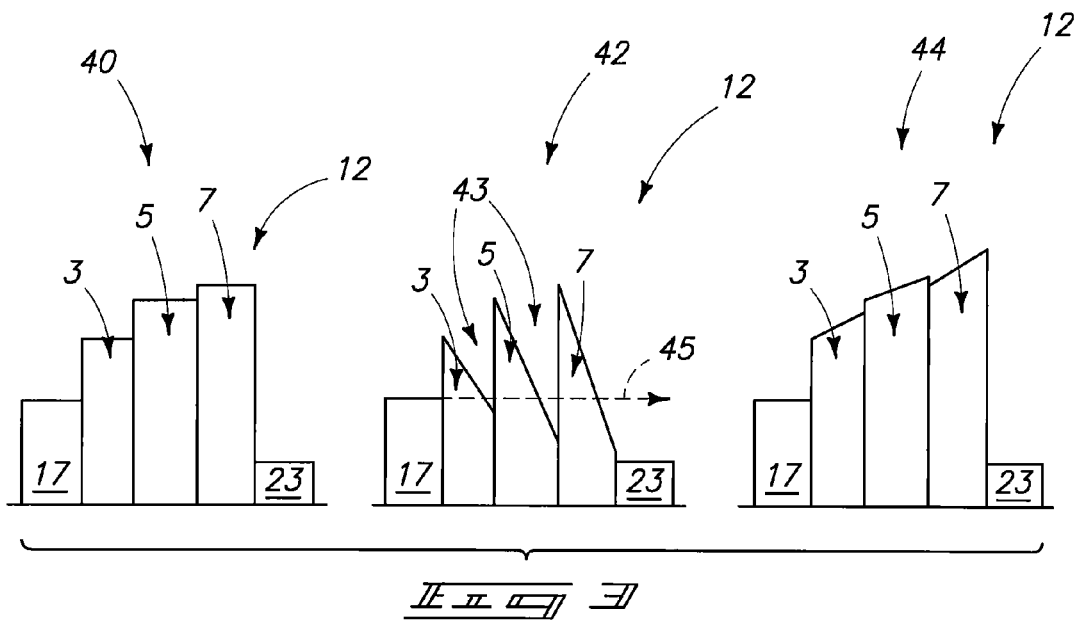
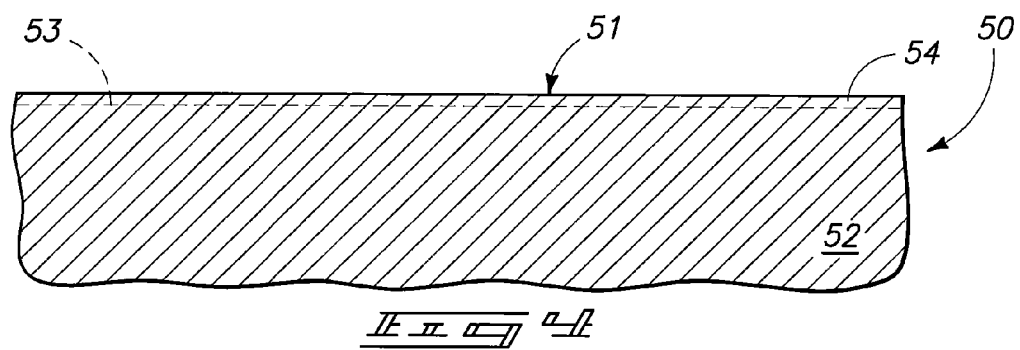
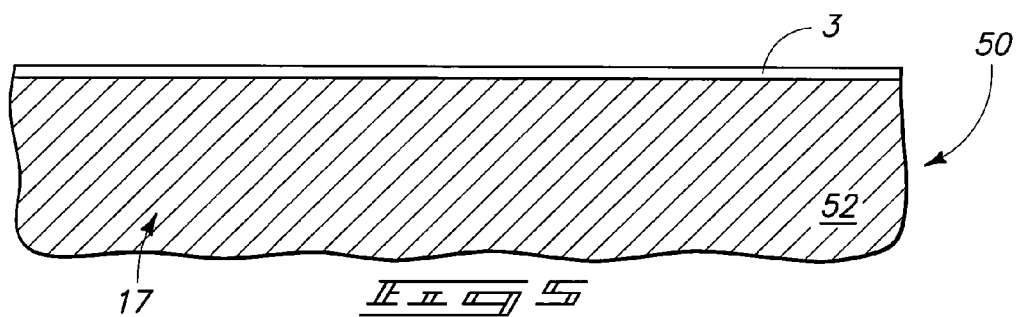

DIODES, AND METHODS OF FORMING DIODES

RELATED PATENT DATA

This patent resulted from a continuation of U.S. patent application Ser. No. 12/875,007, which was filed Sep. 2, 2010, and which is hereby incorporated herein by reference; which resulted from a continuation of U.S. patent application Ser. No. 12/128,334, which was filed May 28, 2008, which is now U.S. Pat. No. 7,811,840, and which is hereby incorporated herein by reference.

TECHNICAL FIELD

Diodes, and methods of forming diodes.

BACKGROUND

Diodes may be utilized in integrated circuitry for numerous applications. For instance, diodes may be utilized for regulating current flow, and/or may be utilized as select devices for selectively accessing components of the integrated circuitry.

A class of diodes that is of particular interest are so called metal-insulator-metal (MIM) diodes, which are diodes having one or more electrically insulative materials sandwiched between a pair of electrically conductive electrodes. The electrodes may be defined to be a first electrode and a second electrode. The diodes may be considered to enable electron flow from the first electrode to the second electrode, and to impede electron flow from the second electrode to the first electrode. Since current flow is defined to be in the opposite direction to electron flow; the diodes may also be considered to enable current flow from the second electrode to the first electrode, and to impede current flow from the first electrode to the second electrode.

A portion of the electrically insulative material between the diodes will be directly against the first electrode. It is desired that the electrically insulative material directly against the first electrode by highly homogenous, and be of high purity, to obtain high reproducibility of diode characteristics from one diode to another. It is proving difficult to form the electrically insulative material to the desired homogeneity and purity with conventional methods using low temperature processes (i.e., processes at less than 450° C.). For instance, the electrically insulative material may be conventionally formed by atomic layer deposition (ALD) of an oxide. The ALD-formed oxide may contain contaminating carbon or other components of precursors utilized in the ALD. The contaminating substances may interfere with performance of diodes having such oxide incorporated therein.

It is desired to develop new methods for forming electrically insulative material of MIM diodes. It is also desired to develop new diode structures having highly homogenous electrically insulative material directly against the first electrode.

BRIEF DESCRIPTION OF THE DRAWINGS

FIG. 3 shows three band-gap diagrams illustrating three different bias conditions of a diode in accordance with an embodiment.

FIGS. 4-6 are diagrammatic, cross-sectional views of a portion of a diode at various processing stages of an embodiment.

DETAILED DESCRIPTION OF THE ILLUSTRATED EMBODIMENTS

Figure 1:
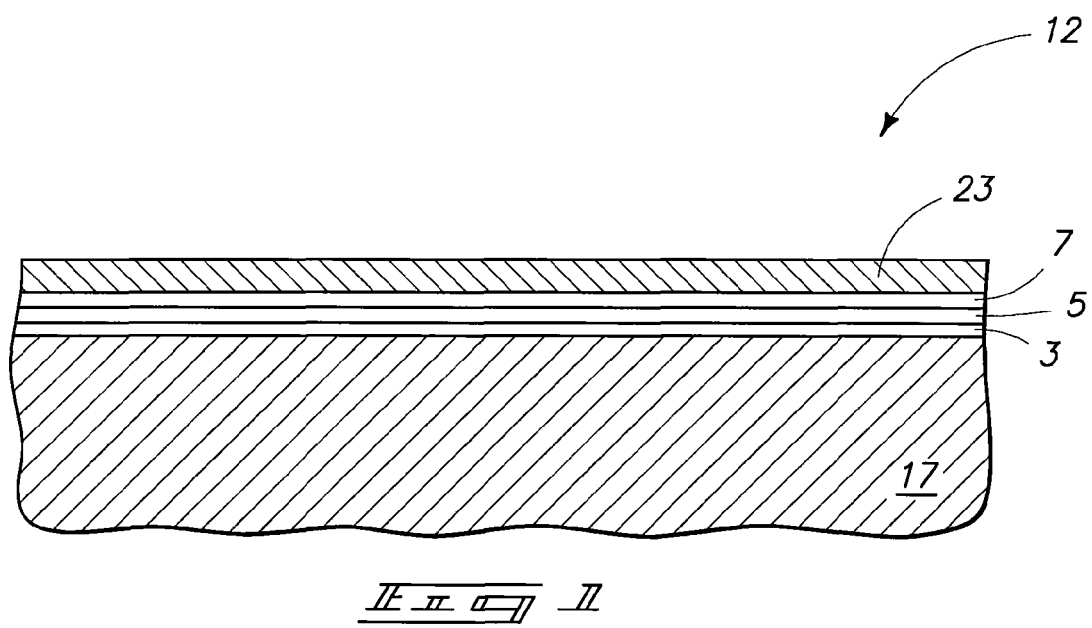
FIG. 1 is a diagrammatic, cross-sectional view of a portion of a semiconductor construction illustrating an embodiment.

In some embodiments, new methods are presented for fabrication of an electrically insulative material utilized in an MIM diode. An example MIM diode 12 is illustrated in FIG. 1. The diode 12 comprises a first electrically conductive electrode 17, a second electrically conductive electrode 23, and a plurality of electrically insulative layers 3, 5 and 7 sandwiched between the first and second electrodes.

The first electrode 17 may comprise one or more electrically conductive materials having a relatively low work function compared to the second electrode; and may, for example, comprise, consist essentially of, or consist of one or more of aluminum, tantalum, tungsten, tantalum silicide, and tantalum silicon nitride.

The second electrode 23 may comprise one or more electrically conductive materials having a relatively high work function compared to the first electrode; and may, for example, comprise, consist essentially of, or consist of one or more of platinum, ruthenium, tantalum nitride, iridium, iridium oxide, ruthenium oxide, molybdenum nitride, and titanium nitride.

The electrically insulative material closest to the first electrode (specifically, electrically insulative material 3) may comprise any suitable composition, but is preferably highly homogeneous and pure. For instance, insulative material 3 may correspond to a layer of silicon dioxide formed to a high level of purity and homogeneity in some embodiments; and in other embodiments may correspond to a layer of metal halide (for instance, calcium fluoride) formed to a high level of purity and homogeneity.

Electrically insulative material 3 may be desired to be less than or equal to about 20 Å thick, or even less than or equal to about 10 Å thick, in some embodiments.

The electrically insulative materials 5 and 7 may be of any suitable composition, and may, for example, comprise, consist essentially of, or consist of zirconium oxide, hafnium oxide, or titanium oxide. Although two electrically insulative materials (5 and 7) are shown formed over the first electrically insulative material 3, in other embodiments there may be other numbers of electrically insulative materials formed over the first electrically insulative material. Generally, there will be at least one electrically insulative material formed over the first electrically insulative material 3.

The diode 12 may be part of a semiconductor construction. Specifically, the diode may be formed over a semiconductor substrate (for instance, a monocrystalline silicon wafer) and incorporated into integrated circuitry supported by the semiconductor substrate. In some embodiments, the diode may be representative of a large array of diodes that are simultaneously formed over a semiconductor substrate.

Figure 2:
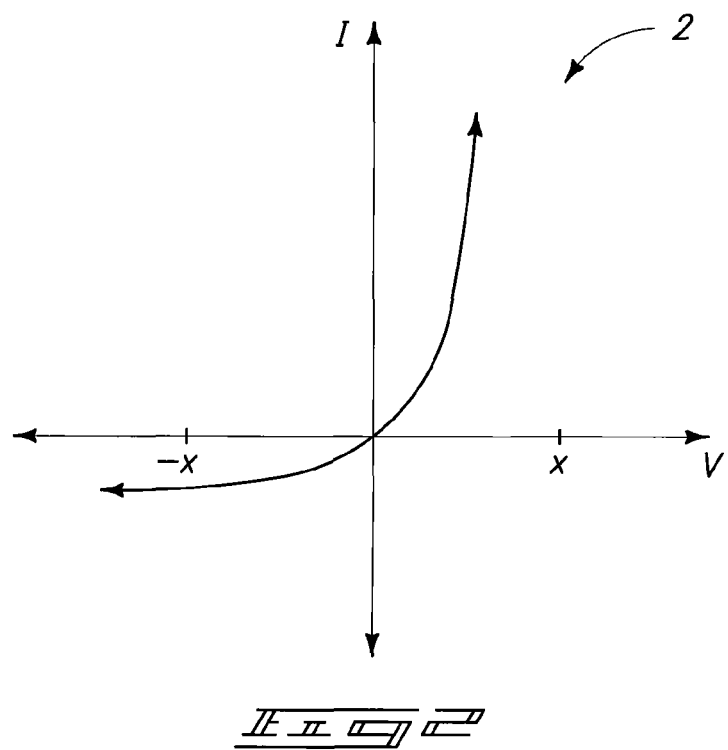
FIG. 2 is a graphical illustration of current versus voltage for a diode.

A diode, by definition, conducts current between the first and second electrodes when voltage of one polarity is applied to the structure, and that inhibits current flow between the first and second electrodes when voltage of an opposite polarity is applied to the structure. FIG. 2 shows a graph 2 that diagrammatically illustrates an example embodiment dependence of current flow on voltage for a diode structure of the type shown in FIG. 1. Specifically, positive voltage may be considered to be one polarity, and negative voltage may be considered to be an opposite polarity. When positive voltage is applied there is high current flow through the structure, and when negative voltage is applied there is relatively little current flow through the structure. A couple of example datapoints "x" and "−x" are shown on the voltage scale. Although the embodiment of FIG. 2 shows increased current flow when positive voltage is applied and impedance when negative voltage is applied, in other embodiments the increased current flow may occur when negative voltage is applied and the impedance may occur when positive voltage is applied.

The various layers of diode 12 may be band-gap engineered to create desired diode properties. FIG. 3 illustrates how the three layers 3, 5 and 7 may be engineered to create desired diode properties. Specifically, FIG. 3 shows band gap diagrams of diode 12 in an unbiased condition (diagram 40), a forward biased condition (diagram 42) and a reverse biased condition (diagram 44). Diagrams 40 and 44 show that in an unbiased condition, and in a reverse biased condition, bands from dielectric materials 3, 5 and 7 preclude migration of carriers between conductive materials 17 and 23. In contrast, diagram 42 shows that tunneling may occur in a forward biased condition so that carriers (specifically electrons in the shown embodiment) may tunnel from conductive material 17 to conductive material 23 via quantum wells 43. The flow of the electrons is diagrammatically illustrated with a dashed arrow 45 in FIG. 3.

Various methods may be utilized for forming diodes of the type illustrated in FIG. 1 as diodes 12. In the prior art, the first electrically insulative material 3 often comprises an oxide (for instance, silicon dioxide); and is formed by atomic layer deposition (ALD) or chemical vapor deposition (CVD). In some embodiments, it is recognized that ALD or CVD of an oxide introduces contaminants into the oxide, and that cleaner oxides (specifically, oxides having higher purity and homogeneity) may be formed by oxidizing semiconductor materials (for instance, silicon), metals (for instance, aluminum) or metal-containing compositions (for instance, metal silicides and metal nitrides).

An example embodiment is described with reference to FIGS. 4-6.

Referring initially to FIG. 4, such shows a structure 50. The structure 50 is electrically conductive, and comprises a surface 51 which is shown to be electrically conductive. The surface may be associated with a region having a different composition than a remainder of structure 50 in some embodiments, and in other embodiments the entirety of structure 50 may be of a single homogeneous composition. A dashed line 53 is provided to diagrammatically illustrate a boundary between a region of structure 50 adjacent surface 51 and a remainder of the structure 50. The region adjacent surface 51 is labeled as 54, and the remainder of structure 50 is labeled as 52. If structure 50 comprises a homogeneous composition throughout (i.e., is a uniform composition throughout), then regions 52 and 54 will be the same composition as one another. Alternatively, if structure 50 comprises a different composition adjacent surface 51 than within the remainder of the structure, then regions 52 and 54 will be of different compositions relative to one another.

An example method of forming structure 50 to have a different composition adjacent surface 51 than within the remainder of the structure is to form the structure by physical vapor deposition (PVD) of a metal silicide (for instance, tantalum silicide) under conditions that create a gradient of silicon enrichment from one region of the first structure to another. The shown structure may be silicon rich adjacent surface 51, and may even consist of silicon along the surface, while the remainder of structure has a substantial amount of metal.

Another example method of forming structure 50 to have a different composition adjacent surface 51 than within the remainder of the structure is to form the structure to have multiple different compositions. Accordingly, the composition formed adjacent surface 51 will be different than at least some of the remainder of the structure 50. In such embodiments, boundary 53 may separate two different compositions one another, rather than delineating regions of a gradient. The composition adjacent surface 51 may comprise an oxidizable material, such as, for example, aluminum or silicon.

The region 54 adjacent surface 51 is oxidized to convert such region to the first electrically insulative material 3. FIG. 5 shows structure 50 after such oxidation.

The oxidation of region 54 (FIG. 4) may comprise any suitable methodology including, for example, electrochemical methods (for instance, anodic oxidation), and/or exposure to one or both of $O_2$ and $O_3$ under oxidative conditions.

In some embodiments, region 54 may comprise, consist essentially of, or consist of chromium, titanium, aluminum or silicon; and may be converted to a layer comprising, consist essentially of, or consisting of chromium oxide, titanium oxide, aluminum oxide or silicon dioxide by anodic oxidation at a temperature of less than or equal to about 450° C.

In other embodiments, region 54 may comprise, consist essentially of, or consist of silicon rich tantalum silicide, and may be converted to a layer comprising, consisting essentially of, or consisting of either silicon or $TaSiO_x$; where "x" is greater than zero. The conversion may comprise anodic oxidation and/or exposure to one or both of $O_2$ and $O_3$; and may be conducted at a temperature of less than or equal to about 500° C. (for instance, it may comprise an $O_2$ anneal at a temperature of about 480° C. for a few seconds). The low temperature enables avoidance of phase separation of the tantalum-silicon relative to an amount of phase separation that may occur at higher temperatures. The low temperature may thus form a more homogeneous oxide 3 than would be formed at higher temperatures.

The oxide 3 of FIG. 5 may be formed to a thickness of less than or equal to about 20 Å, and in some embodiments may be formed to a thickness of less than or equal to about 10 Å. The thickness of oxide 3 may be tailored by controlling the aggressiveness of the oxidation conditions, the time of exposure to the oxidation conditions, and/or the thickness of the region 54 in those embodiments in which region 54 is of a different composition to a remainder of structure 50.

An advantage of the processing of the embodiment of FIGS. 4 and 5 relative to the prior art is that the embodiment forms oxide by oxidation of metal and/or semiconductor material, rather than by direct deposition of the oxide. Metal and/or semiconductor may be formed to be cleaner than oxide in that contaminants (such as carbon) may be better avoided during deposition of metal and/or semiconductor material than they can be during deposition of oxide. Accordingly, the formation of oxide by oxidation of a metal and/or semiconductor material may lead to a better quality oxide relative to oxides deposited by ALD or CVD.

The region 52 of structure 50 at the processing stage of FIG. 5 corresponds to a first electrode 17 of a diode. In some embodiments, other conductive materials may be formed adjacent the region 52 so that the region 52 is a part of the first electrode, rather than an entirety of the first electrode.

Figure 6:
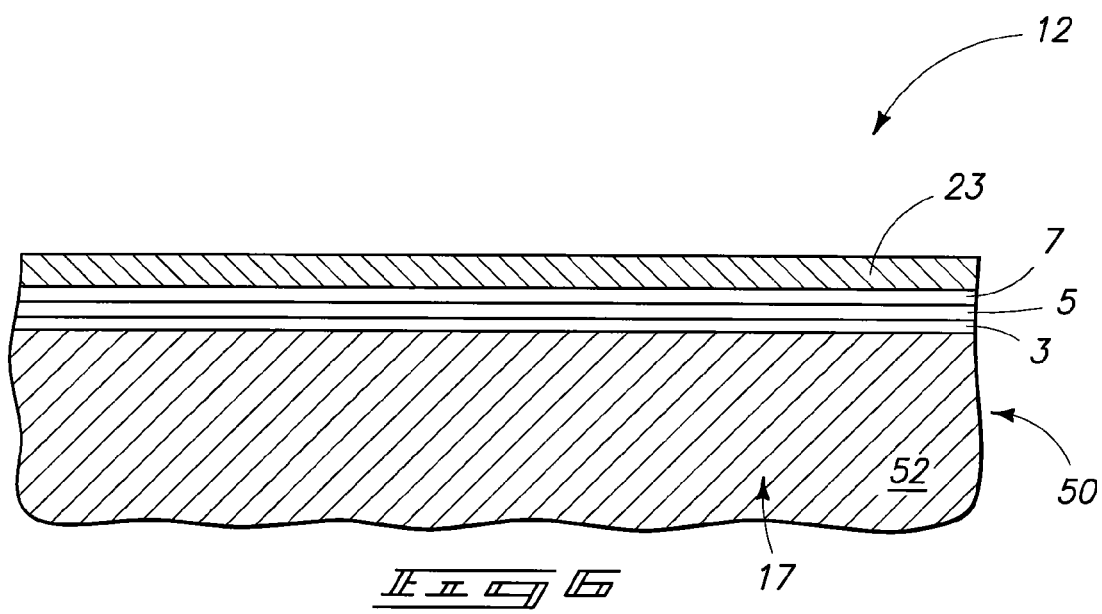

FIG. 6 shows a diode 12 formed after subsequent processing to deposit one or more electrically insulative layers over oxide 3 (specifically, the insulative layers 5 and 7 are shown in FIG. 6), followed by formation of the second diode electrode 23 over the electrically insulative layers. The electrodes 17 and 23, together with oxide 3 and insulative layers 5 and 7, form a diode; or in other words form a construction that conducts current between the first and second electrodes when voltage of one polarity is applied to the construction, and that inhibits current flow between the first and second electrodes when voltage having a polarity opposite to said one polarity is applied to the construction.

Another method of forming a diode is described with reference to FIGS. 7-9.

Figure 7:
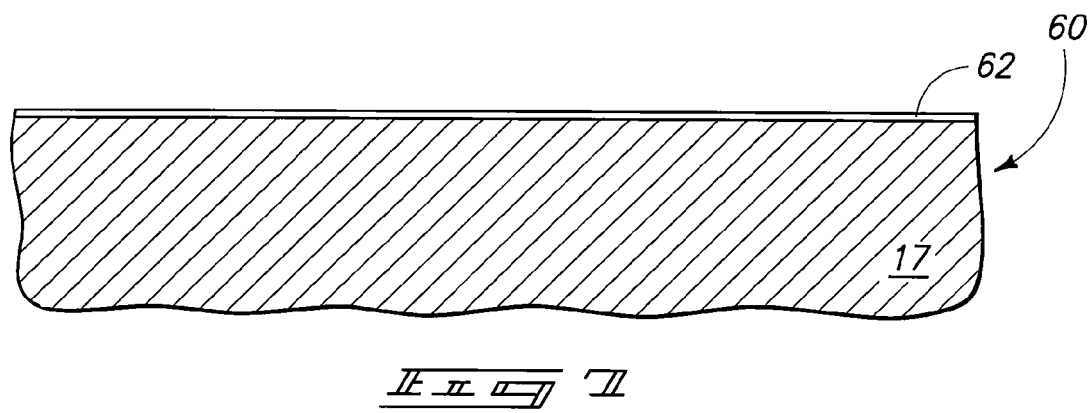
FIGS. 7-9 are diagrammatic, cross-sectional views of a portion of a diode at various processing stages of an embodiment.

FIG. 7 shows a structure 60 comprising a first electrode 17 having an oxidizable material 62 deposited thereover. The oxidizable material may, for example, comprise, consist essentially of, or consist of one or more of aluminum, chromium, hafnium, magnesium, niobium, silicon, germanium, tantalum, titanium, yttrium and zirconium. In some embodiments, material 62 may be referred to as a sacrificial material in that the material 62 may be completely oxidized and converted to a new composition. In some embodiments, first electrode 17 may be considered to be a base supporting material 62.

Material 62 may be deposited by any suitable method, including, for example, ALD. An advantage to utilizing ALD may be that such can form material 62 to be highly conformal across a surface of first electrode 17, and to be very thin. For instance, it may be desired to form material 62 to be of a thickness such that the material 62 may be entirely oxidized to form a layer having a thickness that remains less than or equal to about 20 Å.

Figure 8:
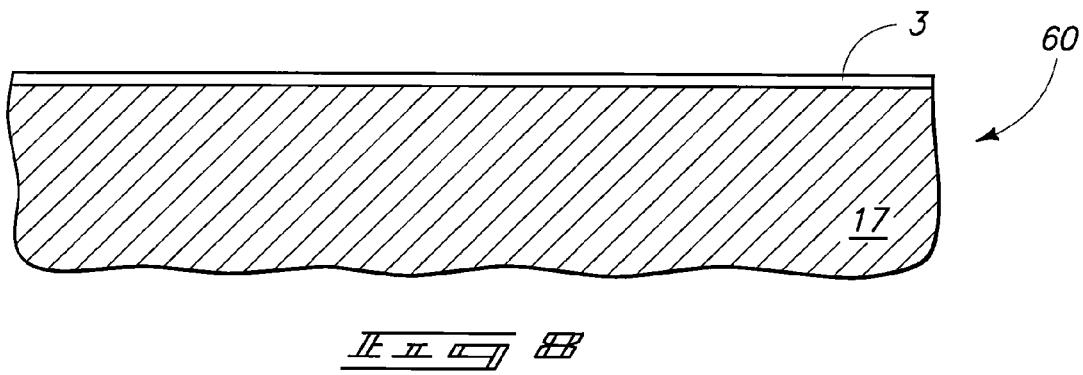

Referring to FIG. 8, layer 62 (FIG. 7) is oxidized to form the oxide material 3. Such oxidation may comprise any suitable methodology, such as, for example, anodic oxidation and/or exposure to one or both of $O_2$ and $O_3$. It may be desired to conduct the oxidation at a temperature of less than or equal to 450° C. to avoid thermally induced problems that may occur relative to the compositions of electrode 17 or oxide 3, and/or that may occur relative to other components associated with a semiconductor construction comprising structure 60.

In the shown embodiment, material 3 of FIG. 8 is thicker than the material 62 of FIG. 7. Such change in thickness may result from the oxidized material 3 comprising larger molecules relative to the non-oxidized starting material 62.

Figure 9:
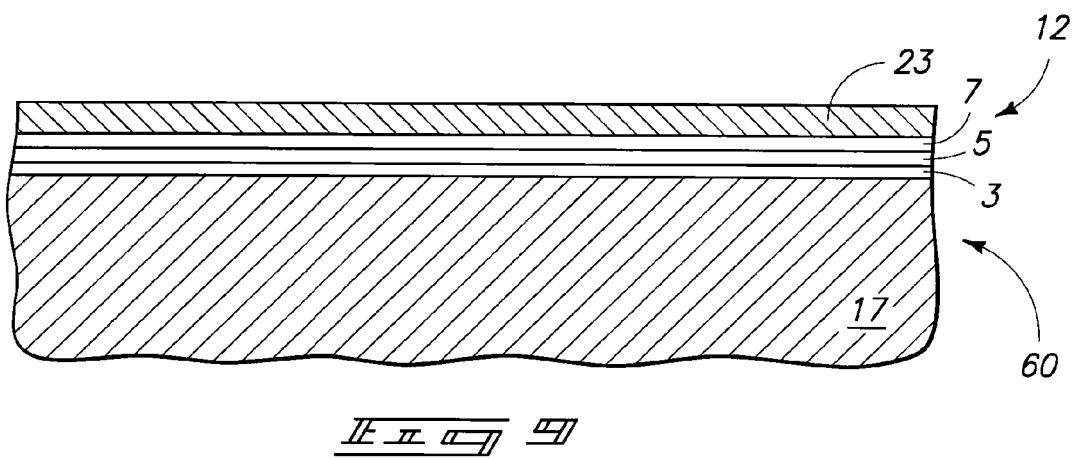

FIG. 9 shows a diode 12 formed after subsequent processing to deposit one or more electrically insulative layers over oxide 3 (specifically, the insulative layers 5 and 7 are shown in FIG. 9), followed by formation of the second diode electrode 23 over the electrically insulative layers. The electrodes 17 and 23, together with oxide 3 and insulative layers 5 and 7, form a diode; or in other words form a construction that conducts current between the first and second electrodes when voltage of one polarity is applied to the construction, and that inhibits current flow between the first and second electrodes when voltage having a polarity opposite to said one polarity is applied to the construction.

Another method of forming a diode is described with reference to FIGS. 10 and 11.

Figure 10:
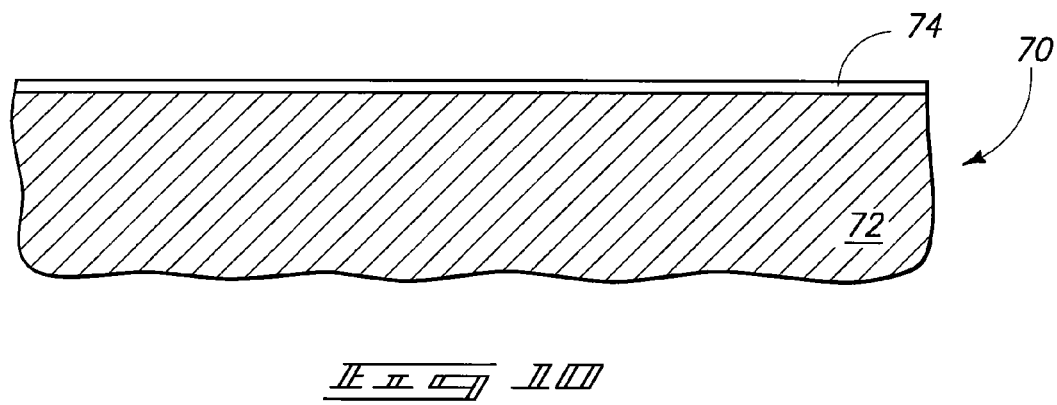
FIGS. 10 and 11 are diagrammatic, cross-sectional views of a portion of a diode at various processing stages of an embodiment.

FIG. 10 shows a structure 70 comprising a first electrically insulative material 74 over a first electrode 72.

Electrode 72 may comprise the same compositions as discussed above regarding electrode 17 of FIG. 1.

Electrically insulative material 72 comprises one or more metal halides, and may be referred to as a metal halide layer. The metal halides may, for example, comprise, consist essentially of, or consist of one or more of various metal fluorides; such as one or more compositions selected from the group consisting of calcium fluoride, barium fluoride, lithium fluoride, magnesium fluoride, lithium beryllium fluoride, sodium beryllium fluoride, potassium beryllium fluoride, rubidium magnesium fluoride, strontium lithium fluoride, and barium lithium fluoride.

The metal halides may be formed by any suitable methods. For instance, a metal fluoride (such as calcium fluoride) may be formed by depositing the metal and then exposing such metal to fluoridation conditions (for instance, exposure to $F_2$ at a temperature of less than or equal to about 450° C.). Alternatively, the metal halide may be formed by ALD or CVD of the metal halide. If ALD or CVD is utilized, it may be desired that such be utilized under processing conditions of less than or equal to about 450° C. to avoid thermally induced problems that may otherwise occur.

The metal halide may be formed to a thickness of less than or equal to about 20 Å, and in some embodiments may be formed to a thickness of less than or equal to about 10 Å.

Metal halides have appropriate bandgap and dielectric constant to be incorporated as insulative material in MIM diodes, and may be formed to high purity and high homogeneity while utilizing relatively low temperature (i.e., less than or equal to about 450° C.) conditions.

Figure 11:
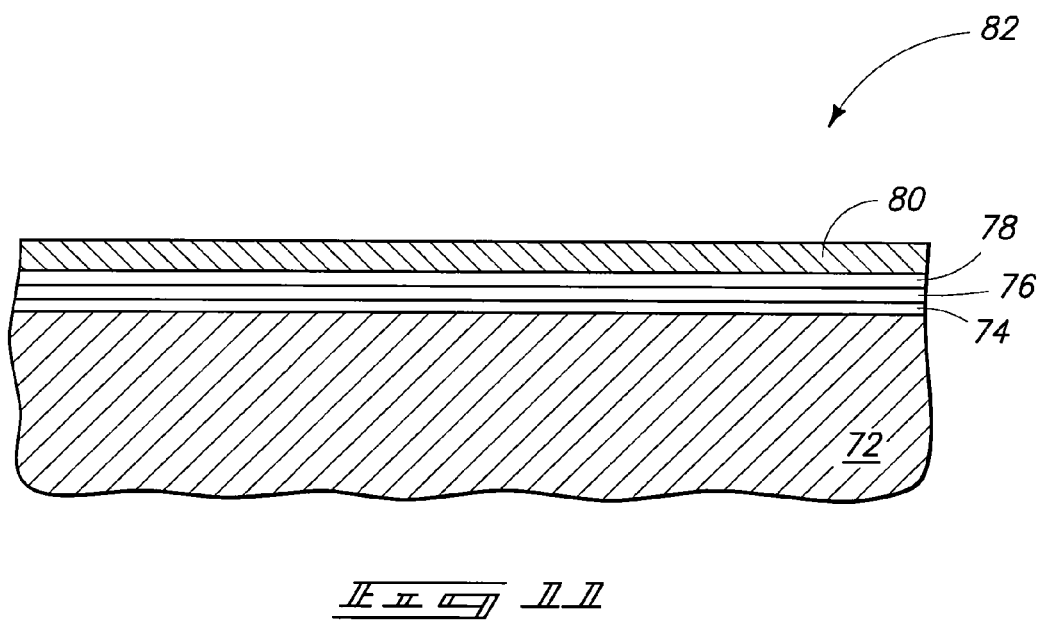

Referring to FIG. 11, one or more electrically insulative layers are formed over metal halide layer 74 (specifically, two electrically insulative layers 76 and 78 are shown), and a second electrode 80 is formed over the electrically insulative layers. The electrically insulative layers 76 and 78 may comprise the same compositions as discussed above with reference to FIG. 1 for layers 5 and 7; and the second electrode 80 may comprise the same compositions as discussed in FIG. 1 for second electrode 23.

The electrodes 72 and 80, together with metal halide layer 74 and insulative layers 76 and 78, form a diode construction 82 that conducts current between the first and second electrodes when voltage of one polarity is applied to the construction, and that inhibits current flow between the first and second electrodes when voltage having a polarity opposite to said one polarity is applied to the construction.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a diode, comprising:
   forming a metal silicide-containing structure, the metal silicide-containing structure having a surface that is silicon rich relative to other metal silicide of the structure;
   oxidizing said surface to form $SiO_2$, and leaving some of the metal silicide not oxidized; the metal silicide that is not oxidized being at least part of a first electrode;
   depositing at least one metal-containing oxide across the $SiO_2$;
   forming a second electrode over said at least one metal-containing oxide; and
   wherein the first electrode, $SiO_2$, at least one metal-containing oxide, and second electrode together form a construction that conducts current between the first and second electrodes when voltage of one polarity is applied to the construction, and that inhibits current flow between the first and second electrodes when voltage having a polarity opposite to said one polarity is applied to the construction.

2. The method of claim 1 wherein the at least one metal-containing oxide includes one or more of zirconium oxide, hafnium oxide and titanium oxide.

3. A method of forming a diode, comprising:
forming a tantalum silicide-containing structure, the tantalum silicide-containing structure having a surface that is silicon rich relative to other tantalum silicide of the structure;
oxidizing said surface to form $TaSiO_x$, where "x" is greater than zero, a portion of the tantalum-silicide-containing structure not being oxidized and being at least a part of a first electrode;
depositing at least one metal-containing oxide across the $TaSiO_x$;
forming a second electrode over said at least one metal-containing oxide; and
wherein the first electrode, $TaSiO_x$, at least one metal-containing oxide, and second electrode together form a construction that conducts current between the first and second electrodes when voltage of one polarity is applied to the construction, and that inhibits current flow between the first and second electrodes when voltage having a polarity opposite to said one polarity is applied to the construction.

4. The method of claim 3 wherein the at least one metal-containing oxide includes one or more of zirconium oxide, hafnium oxide and titanium oxide.

5. A method of forming a diode, comprising:
forming a first electrode;
forming a metal halide layer over the first electrode, the metal halide layer being formed under conditions which keep a temperature of the metal halide layer at less than or equal to about 450° C.;
depositing at least one metal-containing oxide across the metal halide layer;
forming a second electrode over said at least one metal-containing oxide; and
wherein the first electrode, metal halide layer, at least one metal-containing oxide, and second electrode together form a structure that conducts current between the first and second electrodes when voltage of one polarity is applied to the structure, and that inhibits current flow between the first and second electrodes when voltage having a polarity opposite to said one polarity is applied to the structure.

6. The method of claim 5 wherein the metal halide layer has a thickness of less than or equal to about 20 Å.

7. The method of claim 5 wherein the metal halide layer consists of one or more of calcium fluoride, barium fluoride, lithium fluoride, magnesium fluoride, lithium beryllium fluoride, sodium beryllium fluoride, potassium beryllium fluoride, rubidium magnesium fluoride, strontium lithium fluoride, and barium lithium fluoride.

8. A diode, comprising:
a first electrode;
a metal halide layer over and directly against the first electrode;
at least one metal-containing oxide over the metal halide layer;
a second electrode over said at least one metal-containing oxide; and
wherein the first electrode, metal halide layer, at least one metal-containing oxide, and second electrode together form a structure that is configured to conduct current between the first and second electrodes when voltage of one polarity is applied to the structure, and that is configured to inhibit current flow between the first and second electrodes when voltage having a polarity opposite to said one polarity is applied to the structure.

9. The diode of claim 8 wherein the metal halide layer consists of one or more of calcium fluoride, barium fluoride, lithium fluoride, magnesium fluoride, lithium beryllium fluoride, sodium beryllium fluoride, potassium beryllium fluoride, rubidium magnesium fluoride, strontium lithium fluoride, and barium lithium fluoride.

* * * * *